US012273071B2

(12) United States Patent
Higuchi et al.

(10) Patent No.: US 12,273,071 B2
(45) Date of Patent: Apr. 8, 2025

(54) CIRCUIT DEVICE AND OSCILLATOR

(71) Applicant: SEIKO EPSON CORPORATION, Tokyo (JP)

(72) Inventors: Teppei Higuchi, Chino (JP); Sho Matsuzaki, Ina (JP); Yuichi Toriumi, Minowa (JP); Toshiya Usuda, Ina (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/617,695

(22) Filed: Mar. 27, 2024

(65) Prior Publication Data

US 2024/0333215 A1   Oct. 3, 2024

(30) Foreign Application Priority Data

Mar. 28, 2023 (JP) ................ 2023-051090

(51) Int. Cl.
*H03B 5/36* (2006.01)
*H03H 9/10* (2006.01)
*H03H 9/25* (2006.01)

(52) U.S. Cl.
CPC ........... *H03B 5/364* (2013.01); *H03H 9/1064* (2013.01); *H03H 9/25* (2013.01)

(58) Field of Classification Search
CPC .......... H03B 5/364; H03B 5/366; H03B 5/04; H03H 9/1064; H03H 9/25
See application file for complete search history.

(56) References Cited

U.S. PATENT DOCUMENTS

| 2005/0110587 A1* | 5/2005 | Knickerbocker, Jr. ...................... H03B 5/366 331/158 |
| 2015/0070100 A1* | 3/2015 | Shimizu .................. H03L 5/00 331/109 |
| 2022/0094302 A1* | 3/2022 | Jung ........................ G06F 1/04 |

FOREIGN PATENT DOCUMENTS

JP   2007-116563 A   5/2007

* cited by examiner

*Primary Examiner* — Jeffrey M Shin
(74) *Attorney, Agent, or Firm* — Harness, Dickey & Pierce, P.L.C.

(57) ABSTRACT

A circuit device includes: a first terminal and a second terminal coupled to a resonator; an amplifier circuit configured to amplify a signal from the first terminal and output the amplified signal to the second terminal; a variable resistance circuit that is provided on a signal path between the amplifier circuit and the second terminal and includes a variable resistor, a first switch provided at one end of the variable resistor, and a second switch provided at the other end of the variable resistor; a third switch coupled in parallel to the variable resistance circuit; and a control circuit configured to control a resistance value of the variable resistor and control the first switch, the second switch, and the third switch to be turned on or off.

8 Claims, 8 Drawing Sheets

CIRCUIT DEVICE AND OSCILLATOR

The present application is based on, and claims priority from JP Application Serial Number 2023-051090, filed Mar. 28, 2023, the disclosure of which is hereby incorporated by reference herein in its entirety.

BACKGROUND

1. Technical Field

The present disclosure relates to a circuit device and an oscillator.

2. Related Art

JP-A-2007-116563 describes a quartz crystal oscillator capable of testing an oscillation marginal degree by controlling coupling of a check resistor provided in series with a quartz crystal resonator by an external control signal.

JP-A-2007-116563 is an example of the related art.

In the quartz crystal oscillator described in JP-A-2007-116563, a parasitic capacitance of the check resistor is added to an oscillation terminal during normal use, so that a negative resistance becomes small.

SUMMARY

A circuit device according to an aspect of the present disclosure includes:
- a first terminal and a second terminal coupled to a resonator;
- an amplifier circuit configured to amplify a signal from the first terminal and output the amplified signal to the second terminal;
- a variable resistance circuit that is provided on a signal path between the amplifier circuit and the second terminal and includes a variable resistor, a first switch provided at one end of the variable resistor, and a second switch provided at the other end of the variable resistor;
- a third switch coupled in parallel to the variable resistance circuit; and
- a control circuit configured to control a resistance value of the variable resistor and control the first switch, the second switch, and the third switch to be turned on or off.

An oscillator according to an aspect of the present disclosure includes:
- a resonator;
- a circuit device coupled to the resonator; and
- a container accommodating the resonator and the circuit device, in which
the circuit device includes:
- a first terminal and a second terminal coupled to the resonator;
- an amplifier circuit configured to amplify a signal from the first terminal and output the amplified signal to the second terminal;
- a variable resistance circuit that is provided on a signal path between the amplifier circuit and the second terminal and includes a variable resistor, a first switch provided at one end of the variable resistor, and a second switch provided at the other end of the variable resistor;
- a third switch coupled in parallel to the variable resistance circuit; and
- a control circuit configured to control a resistance value of the variable resistor and control the first switch, the second switch, and the third switch to be turned on or off.

DESCRIPTION OF EMBODIMENTS

Hereinafter, preferred embodiments of the present disclosure will be described in detail with reference to the drawings. The embodiments to be described below do not unduly limit contents of the present disclosure described in the claims. In addition, not all configurations to be described below are necessarily essential components of the present disclosure.

1. Configuration of Oscillator

Figure 1:
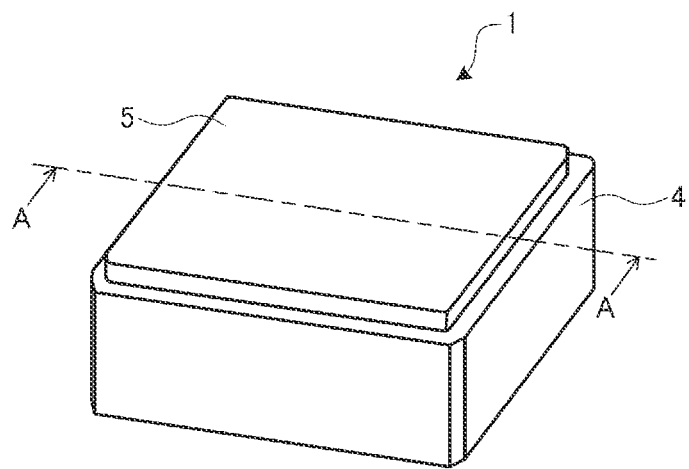
FIG. 1 is a perspective view of an oscillator according to an embodiment.
Figure 2:
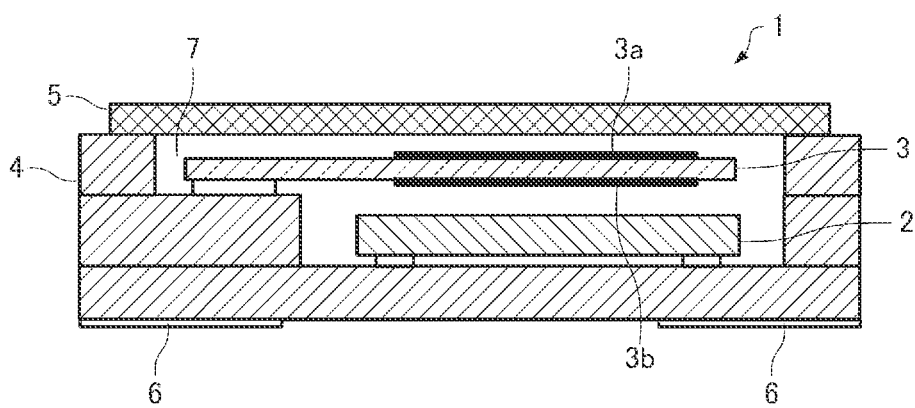
FIG. 2 is a cross-sectional view of the oscillator according to the embodiment.
Figure 3:
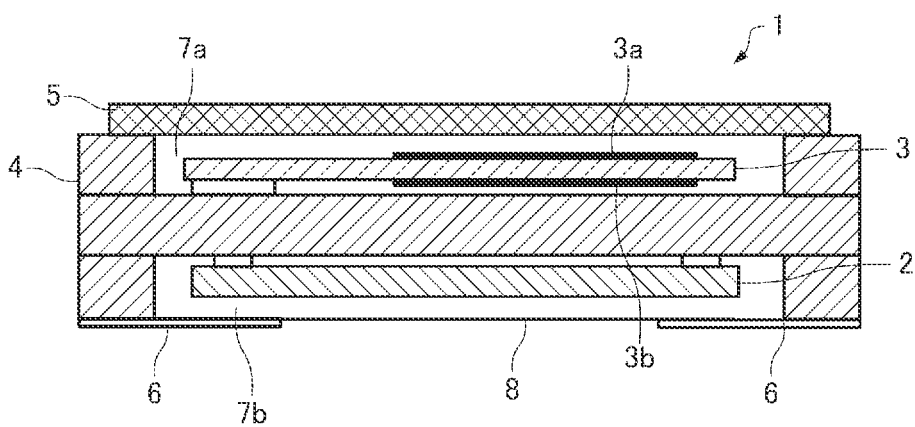
FIG. 3 is another cross-sectional view of the oscillator according to the embodiment.
Figure 4:
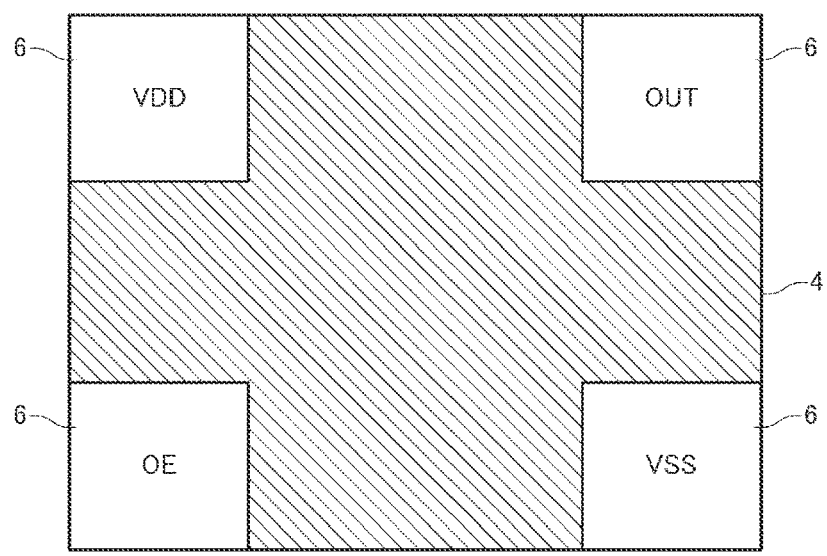
FIG. 4 is a bottom view of the oscillator according to the embodiment.

FIGS. 1 to 4 are diagrams showing an example of a structure of an oscillator 1 of the embodiment. FIG. 1 is a perspective view of the oscillator 1. FIG. 2 is an example of a cross-sectional view taken along line A-A in FIG. 1. FIG. 3 is another example of the cross-sectional view taken along line A-A in FIG. 1. FIG. 4 is a bottom view of the oscillator 1.

As shown in FIGS. 1 to 3, the oscillator 1 includes a circuit device 2, a resonator 3, a package 4, a lid 5, and a plurality of external terminals 6. In the embodiment, the resonator 3 is a quartz crystal resonator using a quartz crystal as a substrate material, and is, for example, an AT cut quartz crystal resonator or a tuning fork type quartz crystal resonator. The resonator 3 may be a SAW resonator. SAW is an abbreviation for surface acoustic wave. As the substrate material for the resonator 3, in addition to the quartz crystal, a a piezoelectric material such as piezoelectric single crystal formed of lithium tantalate, lithium niobate, or the like, a piezoelectric ceramic formed of lead zirconate titanate or the like can be used. As an excitation unit of the resonator 3, a unit based on a piezoelectric effect may be used. In the embodiment, the circuit device 2 is implemented by a one-chip integrated circuit. However, at least a part of the circuit device 2 may be implemented by discrete components.

The oscillator 1 shown in FIG. 2 is an oscillator having a single seal structure, and the package 4 is a container that accommodates the circuit device 2 and the resonator 3 in the same space. Specifically, the package 4 is formed with a recess, and the recess is covered with the lid 5 to form a housing chamber 7. The oscillator 1 shown in FIG. 3 is an oscillator having an H-shaped structure, and the package 4 is a container that accommodates the circuit device 2 and the resonator 3 in different spaces. Specifically, the package 4 is formed with two recesses on facing surfaces thereof, the lid 5 covers one recess to form a housing chamber 7a, and a sealing member 8 covers the other recess to form a housing chamber 7b. The resonator 3 is housed in the housing chamber 7a, and the circuit device 2 is housed in the housing chamber 7b.

The resonator 3 includes metal excitation electrodes 3a and 3b on a front surface and a back surface of the resonator 3, and oscillates at a desired: frequency according to a shape and mass of the resonator 3 including the excitation electrodes 3a and 3b. Interconnects (not shown) for electrically coupling two terminals of the circuit device 2, specifically, a T1 terminal and a T2 terminal of FIG. 5 to the two excitation electrodes 3a and 3b of the resonator 3 are provided inside the package 4 or at a surface of the recess. Interconnects (not shown) for electrically coupling the terminals of the circuit device 2 to the external terminals 6 provided on a bottom surface of the package 4, respectively, are provided inside the package 4 or at the surface of the recess.

As shown in FIG. 4, in the oscillator 1 of the embodiment, four external terminals 6 including a VDD terminal which is a power supply terminal to which a power supply voltage Vdd is supplied, a VSS terminal which is a ground terminal to which a ground voltage Vss is supplied, an OUT terminal which is an output terminal, and an OE terminal which is an output enable terminal are provided on a back surface of the package 4 which is a bottom surface. That is, in the embodiment, the package 4 includes the four external terminals 6, that is, the VDD terminal, the VSS terminal, the OUT terminal, and the OE terminal.

Figure 5:
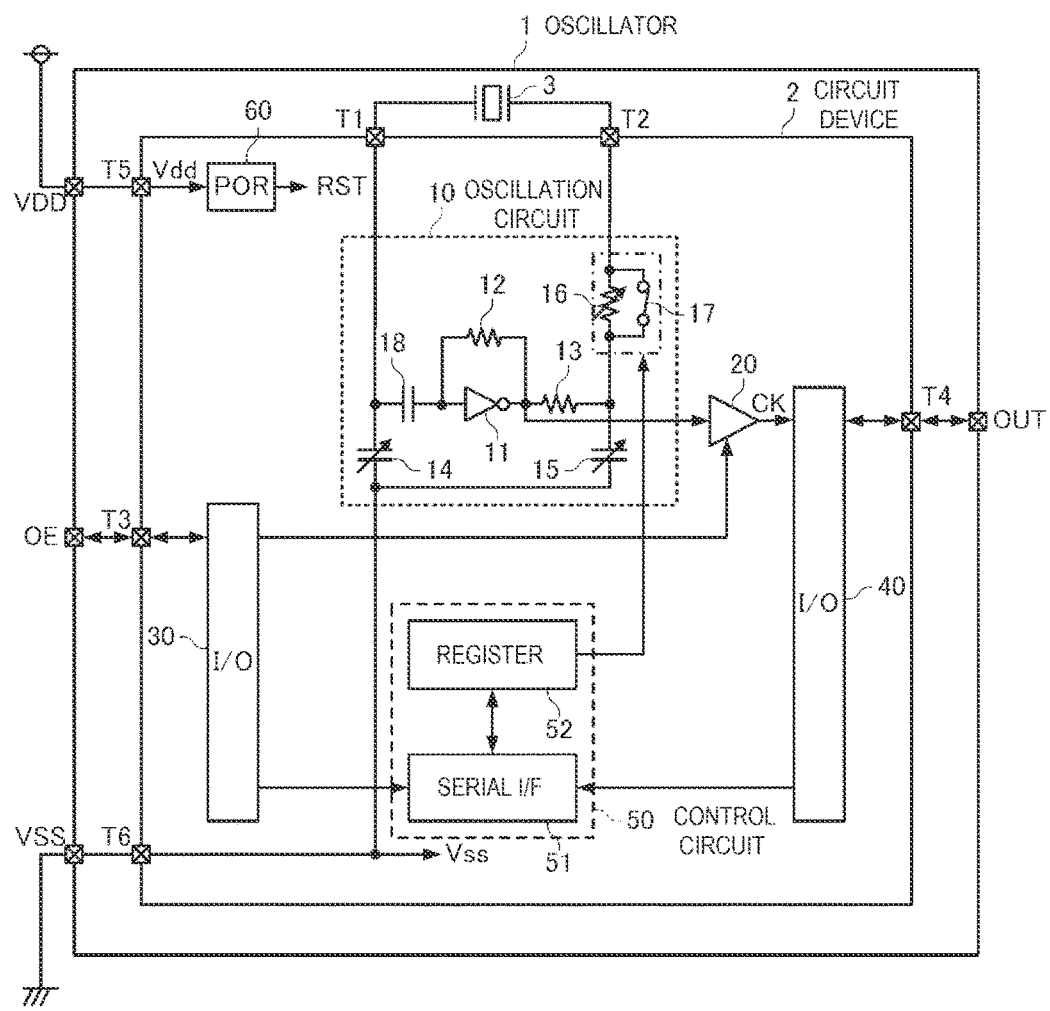
FIG. 5 is a functional block diagram of the oscillator according to the embodiment.

FIG. 5 is a functional block diagram of the oscillator 1 according to the embodiment. As shown in FIG. 5, the oscillator 1 according to the embodiment includes the circuit device 2 and the resonator 3. The circuit device 2 includes the T1 terminal, the T2 terminal, a T3 terminal, a T4 terminal, a T5 terminal, and a T6 terminal as external coupling terminals. The T1 terminal is electrically coupled to one end of the resonator 3, and the T2 terminal is electrically coupled to the other end of the resonator 3. The T3 terminal, the T4 terminal, the T5 terminal, and the T6 terminal are electrically coupled to the OE terminal, the OUT terminal, the VDD terminal, and the VSS terminal, respectively, which are the plurality of external terminals 6 of the oscillator 1 shown in FIG. 4.

In the embodiment, the circuit device 2 includes an oscillation circuit 10, an output buffer 20, a first input and output circuit 30, a second input and output circuit 40, a control circuit 50, and a power-on reset circuit 60. The circuit device 2 may have a configuration obtained by omitting or changing some of the elements, or adding other elements.

The oscillation circuit 10 is coupled to the T1 terminal and the T2 terminal, and oscillates the resonator 3 to generate an oscillation signal. The oscillation circuit 10 includes an amplifier circuit that amplifies a signal from the T1 terminal and outputs the amplified signal to the T2 terminal. Specifically, the oscillation circuit 10 receives a signal output from the resonator 3 via the T1 terminal, amplifies the signal by the amplifier circuit, and supplies the amplified signal to the resonator 3 via the T2 terminal. For example, as shown in FIG. 5, the oscillation circuit 10 includes a logic inversion circuit 11, resistors 12 and 13, variable capacitance circuits 14 and 15, a variable resistance circuit 16, a switch 17, and a capacitance element 18.

One end of the variable capacitance circuit 14 is coupled to the T1 terminal, and the ground voltage Vss is supplied to the other end. One end of the variable capacitance circuit 15 is coupled to the T2 terminal, and the ground voltage Vss is supplied to the other end. One end of the capacitance element 18 is coupled to the T1 terminal, and the other end is coupled to one end of the resistor 12 and an input terminal of the logic inversion circuit 11.

The input terminal of the logic inversion circuit 11 is coupled to the other end of the capacitance element 18 and the one end of the resistor 12, and an output terminal of the logic inversion circuit 11 is coupled to the other end of the resistor 12 and one end of the resistor 13. The other end of the resistor 13 is coupled to the one end of the variable capacitance circuit 15, one end of the variable resistance circuit 16, and one end of the switch 17. The other end of the variable resistance circuit 16 and the other end of the switch 17 are coupled to the T2 terminal. That is, the variable resistance circuit 16 is provided on a signal path between the logic inversion circuit 11, which is an amplifier circuit, and the T2 terminal. The switch 17 is provided on a signal path between the logic inversion circuit 11, which is an amplifier circuit, and the T2 terminal, and is coupled in parallel with the variable resistance circuit 16.

In the oscillation circuit 10 configured as described above, the signal received from the resonator 3 via the T1 terminal is input to the logic inversion circuit 11 with a DC component cut by the capacitance element 18. When the switch 17 is on, a signal inverted and amplified by the logic inversion circuit 11 which is an amplifier circuit is supplied to the resonator 3 via the resistor 13, the switch 17, and the T2 terminal. Accordingly, the resonator 3 oscillates. On the other hand, when the switch 17 is off, the signal inverted and amplified by the logic inversion circuit 11 is supplied to the resonator 3 via the resistor 13, the variable resistance circuit 16, and the T2 terminal, and the resonator 3 oscillates.

The variable capacitance circuits 14 and 15 function as load capacitances of the resonator 3. An oscillation frequency of the resonator 3 decreases as capacitance values of the variable capacitance circuits 14 and 15 increase, and the oscillation frequency of the resonator 3 increases as the capacitance values of the variable capacitance circuits 14 and 15 decrease. The variable capacitance circuits 14 and 15 are provided for adjusting the oscillation frequency such that the resonator 3 oscillates at a desired frequency. Information for setting the capacitance values of the variable capacitance circuits 14 and 15 is stored in a nonvolatile memory (not shown).

Figure 6:
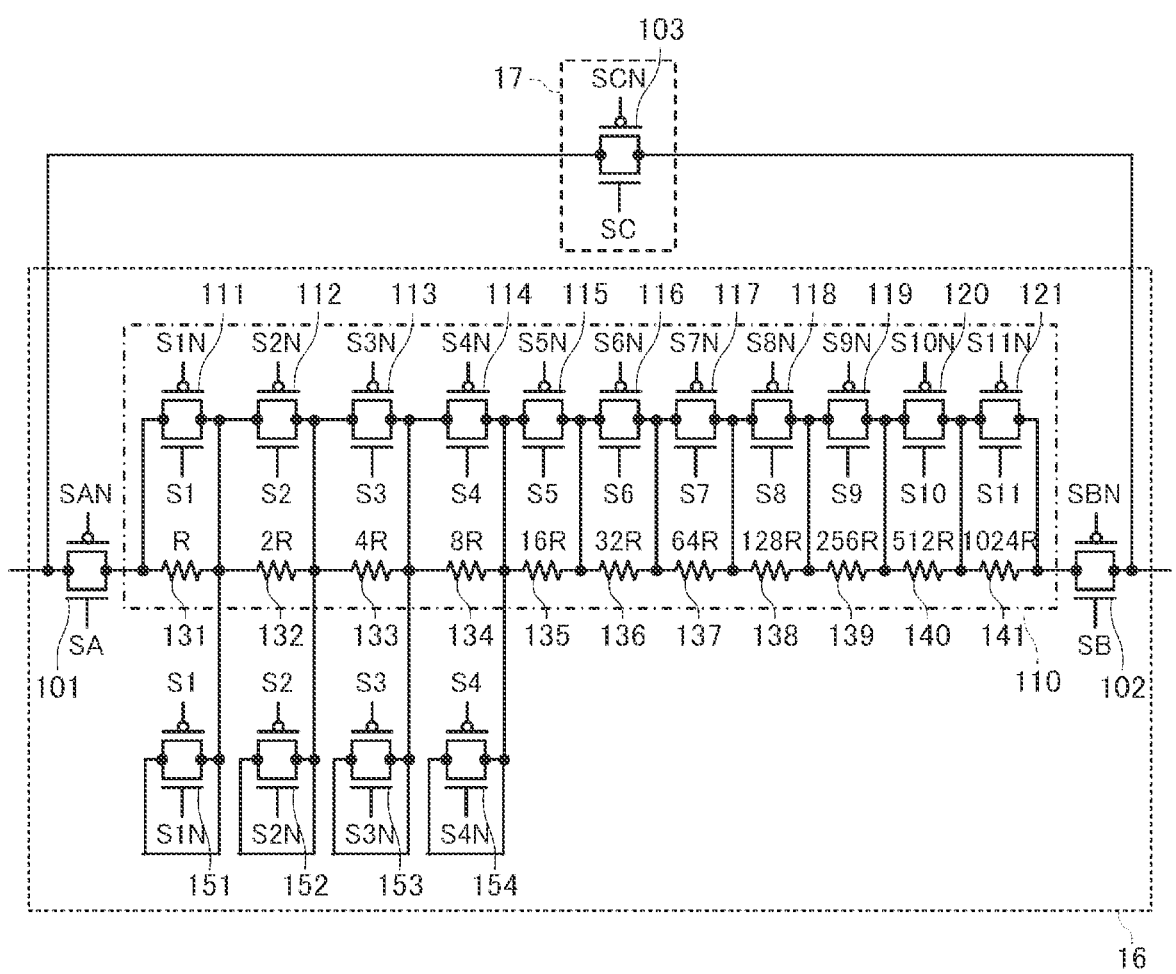
FIG. 6 is a diagram showing a configuration example of a variable resistance circuit and a switch.

FIG. 6 is a diagram showing a configuration example of the variable resistance circuit 16 and the switch 17. As shown in FIG. 6, the variable resistance circuit 16 includes a variable resistor 110, a switch 101 provided at one end of the variable resistor 110, and a switch 102 provided at the other end of the variable resistor 110. The variable resistance circuit 16 includes a plurality of dummy switches 151 to 154. The variable resistor 110 includes a plurality of switches 111 to 121 and a plurality of resistors 131 to 141. The switch 17 includes a switch 103.

In FIG. 6, each of the switches 101, 102, 103, and 111 to 121 and the dummy switches 151 to 154 is a transmission gate in which an NMOS transistor and a PMOS transistor are coupled in parallel.

One end of the switch 101 is coupled to one end of the switch 103, the other end of the resistor 13 in FIG. 5, the one end of the variable capacitance circuit 15, and an input terminal of the output buffer 20. One end of the switch 102 is coupled to the other end of the switch 103 and the T2 terminal in FIG. 5.

The resistors 131 to 141 are coupled in series between the other end of the switch 101 and the other end of the switch 102. The switches 111 to 121 are coupled in parallel with the resistors 131 to 141. The resistors 131 to 141 include at least two resistors having different resistance values. In the example of FIG. 6, the resistors 131 to 141 have different resistance values. Specifically, resistance values of the switches 112 to 121 are doubled from 2R to 1024R with respect to a resistance value R of the switch 111. That is, the resistance values of the plurality of resistors 131 to 141 are binary weighted.

The dummy switch 151 is coupled to the resistor 131 having the smallest resistance value among the plurality of resistors 131 to 141. Specifically, both ends of the dummy switch 151 are coupled to a node to which the resistor 131 and the resistor 132 are coupled.

The dummy switch 152 is coupled to the resistor 132 having the second smallest resistance value among the plurality of resistors 131 to 141. Specifically, both ends of the dummy switch 152 are coupled to a node to which the resistor 132 and the resistor 133 are coupled.

The dummy switch 153 is coupled to the resistor 133 having the third smallest resistance value among the plurality of resistors 131 to 141. Specifically, both ends of the dummy switch 153 are coupled to a node to which the resistor 133 and the resistor 134 are coupled.

The dummy switch 154 is coupled to the resistor 134 having the fourth smallest resistance value among the plurality of resistors 131 to 141. Specifically, both ends of the dummy switch 154 are coupled to a node to which the resistor 134 and the resistor 135 are coupled.

Two control signals S1 and S1N whose logic levels are inverted from each other are input to the switch 111. Specifically, the control signals S1 and S1N are respectively input to gates of the NMOS transistor and the PMOS transistor forming the switch 111. The switch 111 is turned on when the control signal S1 is at a high level, and the switch 111 is turned off when the control signal S1 is at a low level.

The switches 112 to 121 operate in the same manner as the switch 111, although the control signals to be received are different. That is, two control signals S2 and S2N whose logic levels are inverted from each other are input to the switch 112. The switch 112 is turned on when the control signal S2 is at a high level, and is turned off when the control signal S2 is at a low level. Two control signals S3 and S3N whose logic levels are inverted from each other are input to the switch 113. The switch 113 is turned on when the control signal S3 is at a high level, and is turned off when the control signal S3 is at a low level. Two control signals S4 and S4N whose logic levels are inverted from each other are input to the switch 114. The switch 114 is turned on when the control signal S4 is at a high level, and is turned off when the control signal S4 is at a low level. Two control signals S5 and S5N whose logic levels are inverted from each other are input to the switch 115. The switch 115 is turned on when the control signal S5 is at a high level, and is turned off when the control signal S5 is at a low level. Two control signals S6 and S6N whose logic levels are inverted from each other are input to the switch 116. The switch 116 is turned on when the control signal S6 is at a high level, and is turned off when the control signal S6 is at a low level. Two control signals S7 and S7N whose logic levels are inverted from each other are input to the switch 117. The switch 117 is turned on when the control signal S7 is at a high level, and is turned off when the control signal S7 is at a low level. Two control signals S8 and S8N whose logic levels are inverted from each other are input to the switch 118. The switch 118 is turned on when the control signal S8 is at a high level, and is turned off when the control signal S8 is at a low level. Two control signals S9 and S0N whose logic levels are inverted from each other are input to the switch 119. The switch 119 is turned on when the control signal S9 is at a high level, and is turned off when the control signal S9 is at a low level. Two control signals S10 and S10N whose logic levels are inverted from each other are input to the switch 120. The switch 120 is turned on when the control signal S10 is at a high level, and is turned off when the control signal S10 is at a low level. Two control signals S11 and S11N whose logic levels are inverted from each other are input to the switch 121. The switch 121 is turned on when the control signal S11 is at a high level, and is turned off when the control signal S11 is at a low level.

Then, among the switches 111 to 121, resistors each coupled to both ends of the switch to be turned off are coupled in series between the switch 101 and the switch 102. For example, when only the control signals S3 and S9 among the control signals S1 to S11 are at the low level, only the switches 113 and 119 among the switches 111 to 121 are turned off, so that the resistors 133 and 139 are coupled in series between the switch 101 and the switch 102. In this case, a resistance value of the variable resistor 110 is 4R+256R=260R. As described above, the switches 111 to 121 are resistance value control switches that control the resistance value of the variable resistor 110.

The switches 101, 102, and 103 operate in the same manner as the switches 111 to 121, although the control signals to be received are different. That is, two control signals SA and SAN whose logic levels are inverted from each other are input to the switch 101. The switch 101 is turned on when the control signal SA is at a high level, and is turned off when the control signal SA is at a low level. Two control signals SB and SBN whose logic levels are inverted from each other are input to the switch 102. The switch 102 is turned on when the control signal SB is at a high level, and is turned off when the control signal SB is at a low level. Two control signals SC and SCN whose logic levels are inverted from each other are input to the switch 103. The switch 103 is turned on when the control signal SC is at a high level, and is turned off when the control signal SC is at a low level.

When the switch 103 is on, the other end of the resistor 13 in FIG. 5 is coupled to the T2 terminal. When the switch 103 is off and the switches 101 and 102 are on, the variable resistor 110 is coupled between the other end of the resistor 13 in FIG. 5 and the T2 terminal.

The two control signals S1 and S1N input to the switch 111 are input to the dummy switch 151. Specifically, the control signals S1N and S1 are respectively input to the gates of the NMOS transistor and the PMOS transistor forming the dummy switch 151. The dummy switch 151 is turned off when the control signal S1 is at the high level, and the dummy switch 151 is turned on when the control signal S1 is at the low level. Accordingly, when the control signal S1 is at the low level, the switch 111 is turned off and the dummy switch 151 is turned on. When the control signal S1 is at the high level, the switch 111 is turned on and the dummy switch 151 is turned off. That is, the dummy switch 151 is turned on or off in a converse logic to that of the switch 111.

The dummy switches 152, 153, and 154 operate in the same manner as the dummy switch 151, although the control signals to be received are different. Specifically, the two control signals S2 and S2N whose logic levels are inverted from each other are input to the dummy switch 152. The dummy switch 152 is turned off when the control signal S2 is at the high level, and turned on when the control signal S2 is at the low level. That is, the dummy switch 152 is turned on or off in a converse logic to that of the switch 112. The two control signals S3 and S3N whose logic levels are inverted from each other are input to the dummy switch 153. The dummy switch 153 is turned off when the control signal S3 is at the high level, and turned on when the control signal S3 is at the low level. That is, the dummy switch 153 is turned on or off in a converse logic to that of the switch 113. The two control signals S4 and S4N whose logic levels are inverted from each other are input to the dummy switch 154. The dummy switch 154 is turned off when the control signal S4 is at the high level, and turned on when the control signal S4 is at the low level. That is, the dummy switch 154 is turned on or off in a converse logic to that of the switch 114.

In FIG. 6, the variable resistance circuit 16 includes the plurality of dummy switches 151 to 154 coupled to a part of the plurality of switches 111 to 121, and may include at least one dummy switch that is coupled to at least a part of the plurality of resistance value control switches and that is turned on or off in a converse logic to that of each of the at least a part of the resistance value control switches.

Referring back to FIG. 5, the output buffer 20 receives the oscillation signal from the oscillation circuit 10 and outputs a clock signal CK. Specifically, the oscillation signal output from the logic inversion circuit 11 of the oscillation circuit 10 is input to the input terminal of the output buffer 20. Then, the output buffer 20 buffers the oscillation signal, and outputs the clock signal CK from an output terminal when a signal input to a control terminal is at the high level. The output buffer 20 outputs the ground voltage Vss from the output terminal when the signal input to the control terminal is at the low level.

The control circuit 50 controls an operation of each circuit. Specifically, the control circuit 50 controls the resistance value of the variable resistor 110 shown in FIG. 6, and controls the switches 101, 102, and 103 to be turned on or off. The control circuit 50 sets an operation mode of the circuit device 2 to one of a plurality of modes including a normal operation mode, an external communication mode, and a test mode. The normal operation mode is an operation mode in which the oscillation circuit 10 performs an oscillation operation in a state where the switches 101 and 102 are off and the switch 103 is on, and the variable resistor 110 is cut off from the resonator 3 as shown in FIG. 6, and whether the clock signal CK is output from the OUT terminal is controlled according to the control signal received from the OE terminal. The external communication mode is an operation mode in which the control circuit 50 communicates with an external device (not shown) via the OE terminal and the OUT terminal. The test mode is an operation mode in which the oscillation circuit 10 performs the oscillation operation in a state where the switches 101 and 102 are on, the switch 103 is off, and the variable resistor 110 is coupled in series to the resonator 3. In the embodiment, as shown in FIG. 5, the control circuit 50 includes a serial interface circuit 51 and a register 52.

When a control signal having a predetermined pattern is received from the OE terminal within a predetermined period after the supply of the power supply voltage Vdd to the VDD terminal is started, the serial interface circuit 51 sets the operation mode to the external communication mode after the predetermined period elapses. When the control signal having the predetermined pattern is not received from the OE terminal within the predetermined period after the supply of the power supply voltage Vdd is started, the serial interface circuit 51 sets the operation mode to the normal operation mode without setting the operation mode to the external communication mode after the predetermined period elapses. For example, the serial interface circuit 51 may set, as the predetermined period, a period from the start of the oscillation of the resonator 3 due to the supply of the power supply voltage Vdd to detection of stable oscillation, or may count the number of pulses of the clock signal CK and determine that the predetermined period elapses when a count value reaches a predetermined value. For example, the serial interface circuit 51 may measure the predetermined period based on an output signal of an RC time constant circuit, which starts an operation upon the supply of the power supply voltage Vdd.

In the external communication mode, the serial interface circuit 51 is electrically coupled to the OE terminal via the first input and output circuit 30, is electrically coupled to the OUT terminal via the second input and output circuit 40, and can perform data communication with the external device (not shown) via the OE terminal and the OUT terminal. In the embodiment, in the external communication mode, the OE terminal and the T3 terminal are serial data terminals, and the OUT terminal and the T4 terminal are serial clock terminals. Then, the external device outputs a serial clock signal to the OUT terminal, outputs a serial data signal to the OE terminal in synchronization with the serial clock signal, or acquires a signal output from the serial interface circuit 51 to the OE terminal, according to a predetermined communication standard. In the external communication mode, the serial interface circuit 51 samples serial data signals as various commands for each edge of the serial clock signal according to, for example, a standard of an I2C bus. I2C is an abbreviation for inter-integrated circuit. Then, the serial interface circuit 51 performs processing such as setting of an operation mode and reading and writing of data from and to the register 52 based on the sampled commands. In the embodiment, the serial interface circuit 51 communicates with an external device according to a communication standard of a two-wire bus such as the I2C bus, and may communicate with an external device according to a communication standard of a three-wire bus such as an SPI bus or a four-wire bus. SPI is an abbreviation for serial peripheral interface.

For example, when the serial interface circuit 51 samples a register setting command, specified data is written into a address of the register 52 specified by the register setting command. The register 52 stores data of a plurality of bits, and outputs a signal for controlling the variable resistance circuit 16 and the switch 17. That is, the register 52 outputs a control signal for turning on or off the switches 101, 102, 103, and 111 to 121 and the dummy switches 151 to 154 shown in FIG. 6.

In the external communication mode, the external device can set the switches 101, 102, 103, and 111 to 121 and the dummy switches 151 to 154 shown in FIG. 6 to on or off, by transmitting the register setting command to the serial interface circuit 51 via the OE terminal and the OUT terminal. When the external device sets the switches 101 and 102 to on and sets the switch 103 to off, and then completes the communication, the operation mode transitions from the external communication mode to the test mode. When the external device sets the switches 101 and 102 to off and sets the switch 103 to on, and then completes the communication, the operation mode transitions from the external communication mode to the normal operation mode.

The first input and output circuit 30 is provided on a signal path between the T3 terminal and the register 52. The first input and output circuit 30 is provided on a signal path between the T3 terminal and the output buffer 20. In the normal operation mode and the test mode, the T3 terminal and the control terminal of the output buffer 20 are electrically coupled to each other via the first input and output circuit 30, and the T3 terminal and the register 52 are electrically cut off from each other. In the external communication mode, the T3 terminal and the register 52 are electrically coupled to each other via the first input and output circuit 30 and the serial interface circuit 51, and the T3 terminal and the control terminal of the output buffer 20 are electrically cut off from each other.

The second input and output circuit 40 is provided on a signal path between the output buffer 20 and the T4 terminal. The second input and output circuit 40 is provided on a signal path between the T4 terminal and the register 52. In the normal operation mode and the test mode, the output terminal of the output buffer 20 and the T4 terminal are electrically coupled to each other via the second input and output circuit 40, and the T4 terminal and the register 52 are electrically cut off from each other. In the external communication mode, the T4 terminal and the register 52 are electrically coupled to each other via the second input and output circuit 40 and the serial interface circuit 51, and the output terminal of the output buffer 20 and the T4 terminal are electrically cut off from each other.

When the supply of the power supply voltage Vdd to the VDD terminal is started, the power-on reset circuit 60 outputs a reset signal RST that is at a high level for a predetermined period. The register 52 is reset by the reset signal RST, the control signals SA, SB, and SCN are initialized to a low level, and the control signals SAN, SBN, and SC are initialized to a high level. Thereafter, when the predetermined period elapses, the operation mode of the circuit device 2 is initialized to the normal operation mode. That is, the circuit device 2 is set to the normal operation mode based on an initial value of the register 52 set at the time of power-on.

As described above, in the external communication mode, a setting value for controlling the variable resistance circuit 16 and the switch 17 is set into the register 52 by communication using the T3 terminal and the T4 terminal.

Figure 7:
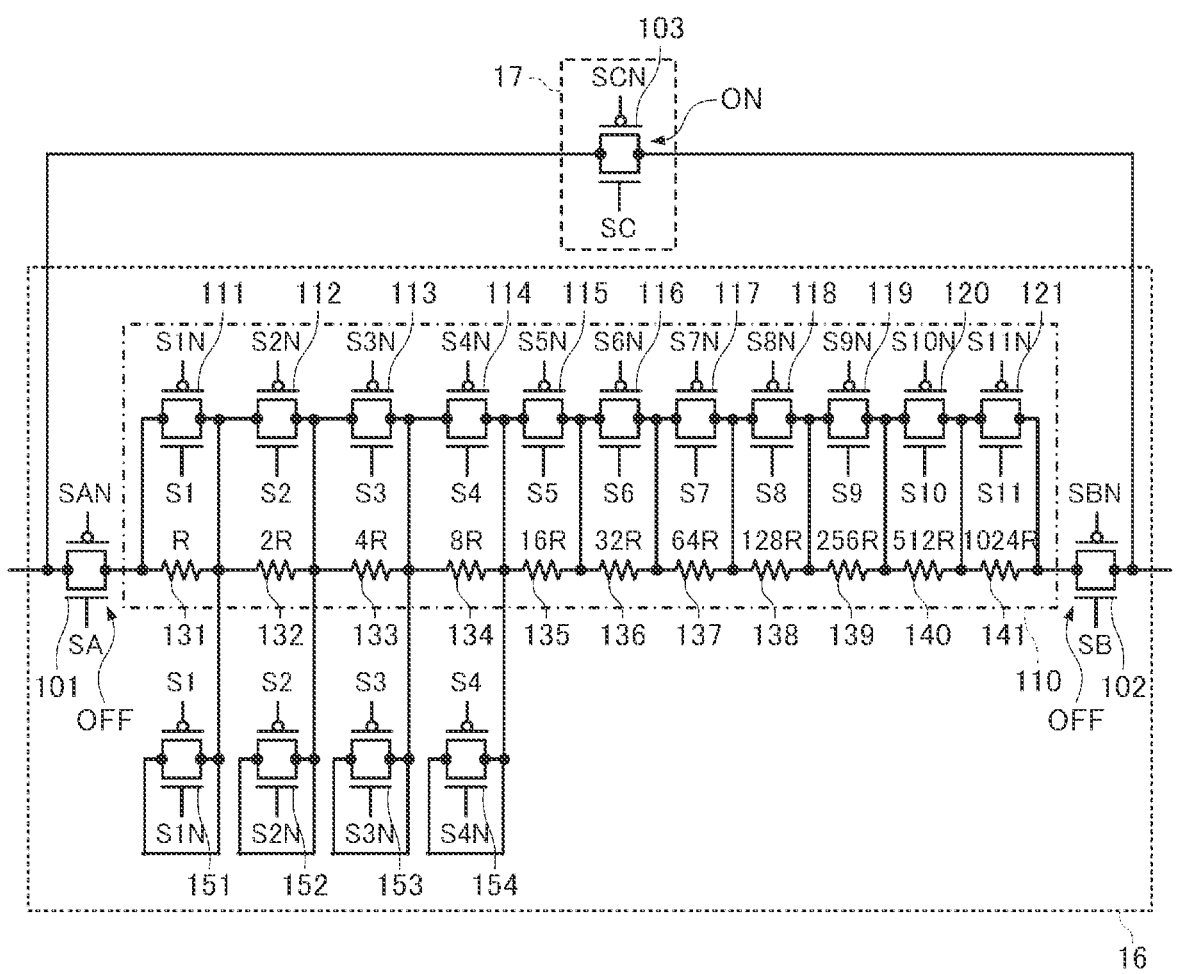
FIG. 7 is a diagram showing states of the variable resistance circuit and the switch in a normal operation mode.

In the normal operation mode, the control signals SA, SB, and SCN are at the low level, the control signals SAN, SBN, and SC are at the high level, and as shown in FIG. 7, the switches 101 and 102 are turned off and the switch 103 is turned on. Accordingly, in the normal operation mode, the oscillation circuit 10 performs the oscillation operation in a state where the variable resistor 110 is cut off from the resonator 3.

Figure 8:
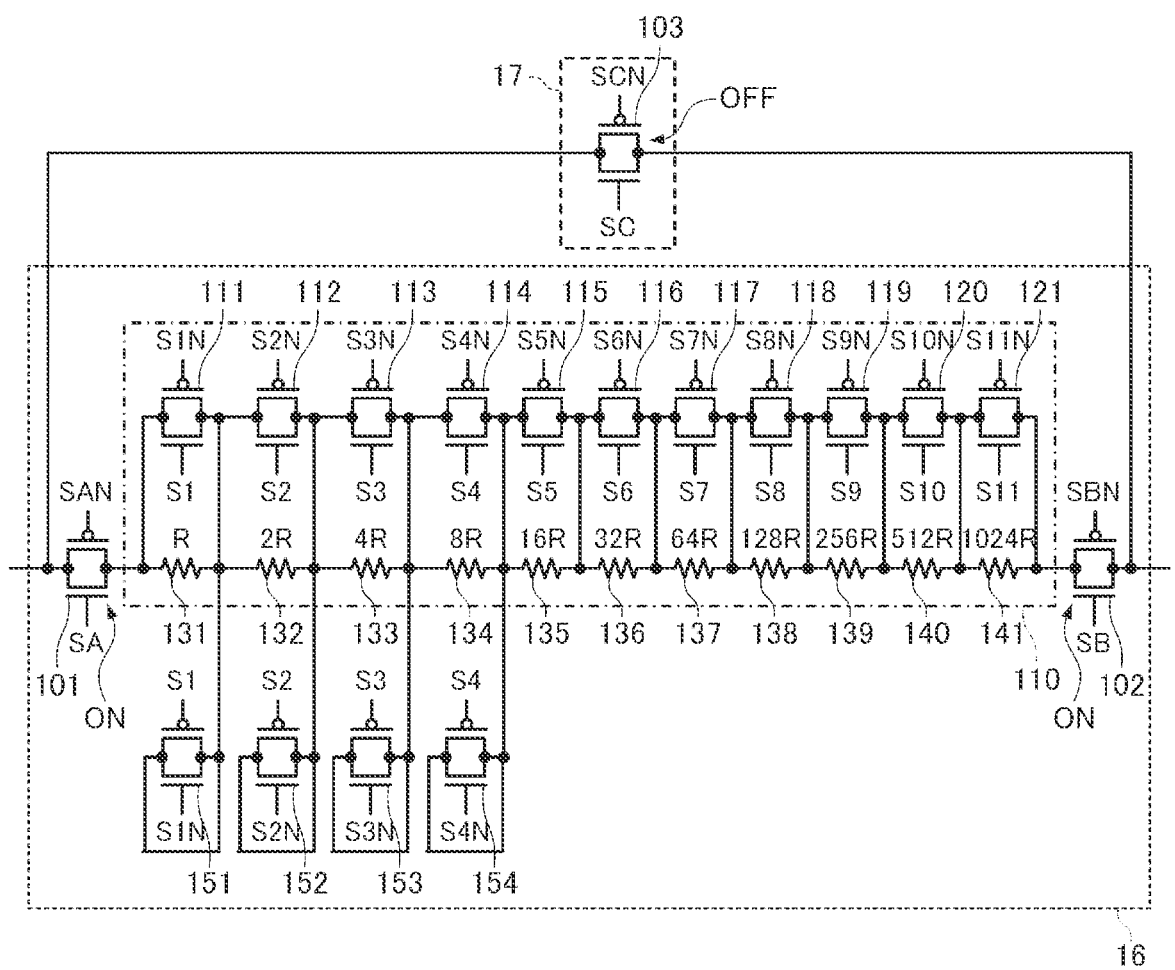
FIG. 8 is a diagram showing states of the variable resistance circuit and the switch in a test mode.

On the other hand, in the test mode, the control signals SA, SB, and SCN are at the high level and the control signals SAN, SBN, and SC are at the low level, and as shown in FIG. 8, the switches 101 and 102 are turned on and the switch 103 is turned off. Accordingly, in the test mode, the oscillation circuit 10 performs the oscillation operation in a state where the variable resistor 110 is coupled in series to the resonator 3.

Then, in any operation mode of the normal operation mode and the test mode, a control signal for controlling the operation of the output buffer 20 is input to the T3 terminal, and the clock signal CK is output from the T4 terminal. That is, the oscillator 1 outputs the clock signal CK from the OUT terminal according to the control signal received from the OE terminal.

In the test mode, since a negative resistance becomes smaller when the variable resistor 110 is coupled in series to the resonator 3, the test device as the external device can test an oscillation marginal degree using the OE terminal and the OUT terminal.

In the embodiment, the T1 terminal is an example of a first terminal, and the T2 terminal is an example of a second terminal. The switch 101 is an example of a first switch, the switch 102 is an example of a second switch, and the switch 17 or the switch 103 is an example of a third switch. The dummy switch 151 is an example of a first dummy switch. The normal operation mode is an example of a first mode, and the test mode is an example of a second mode.

2. Method of Testing Oscillation Marginal Degree

As described above, in the embodiment, in the test mode, since the variable resistor 110 is coupled in series to the resonator 3, the test device as the external device can test the oscillation marginal degree using the OE terminal and the OUT terminal.

Figure 9:
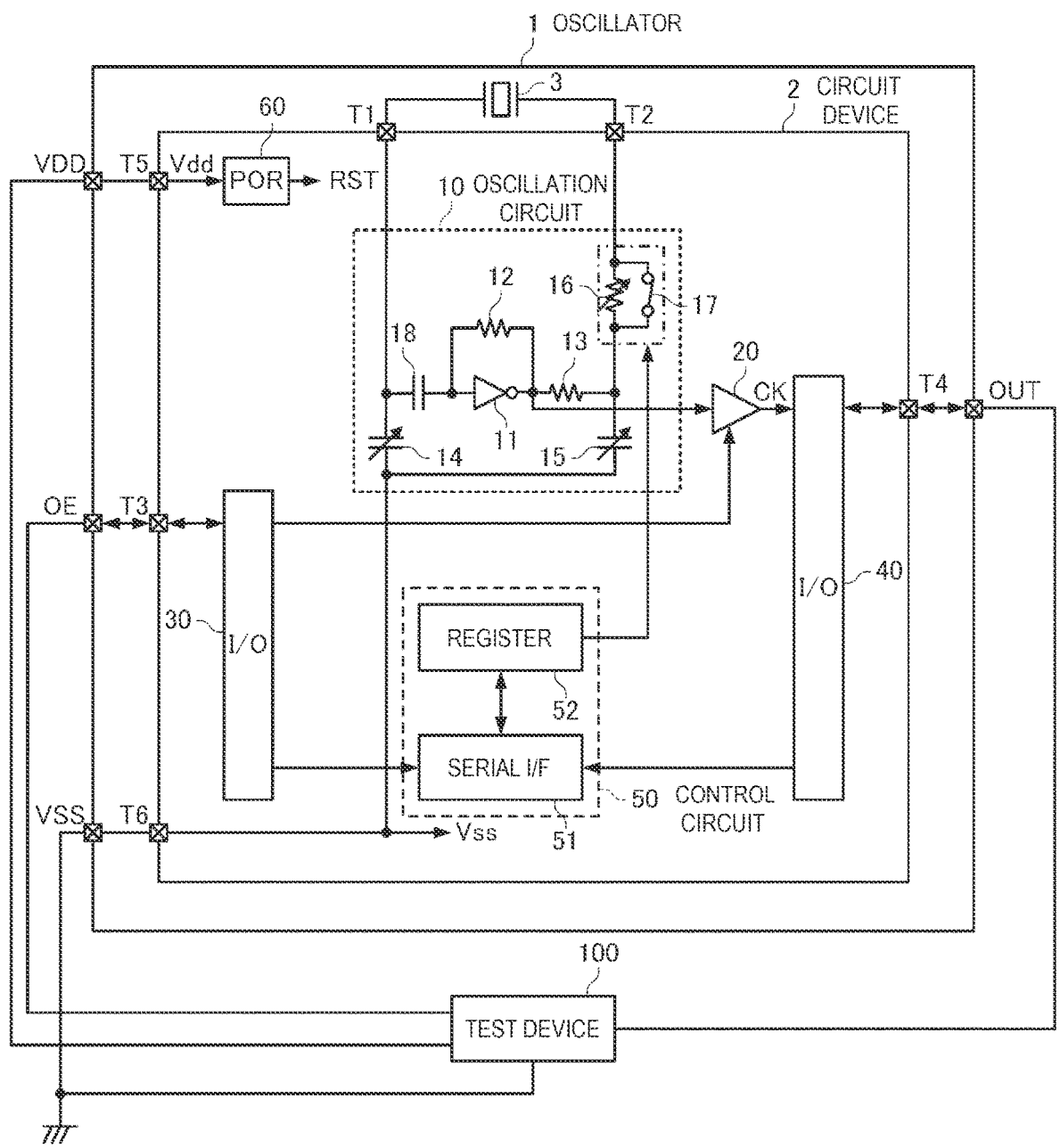
FIG. 9 is a diagram showing a configuration of a test system in which a test device is coupled to the oscillator according to the embodiment.

FIG. 9 is a diagram showing a configuration of a test system in which a test device 100 is coupled to the oscillator 1. As shown in FIG. 9, the test device 100 is coupled to the VDD terminal, the VSS terminal, the OE terminal, and the OUT terminal of the oscillator 1. The ground of the oscillator 1 and the ground of the test device 100 are common.

Figure 10:
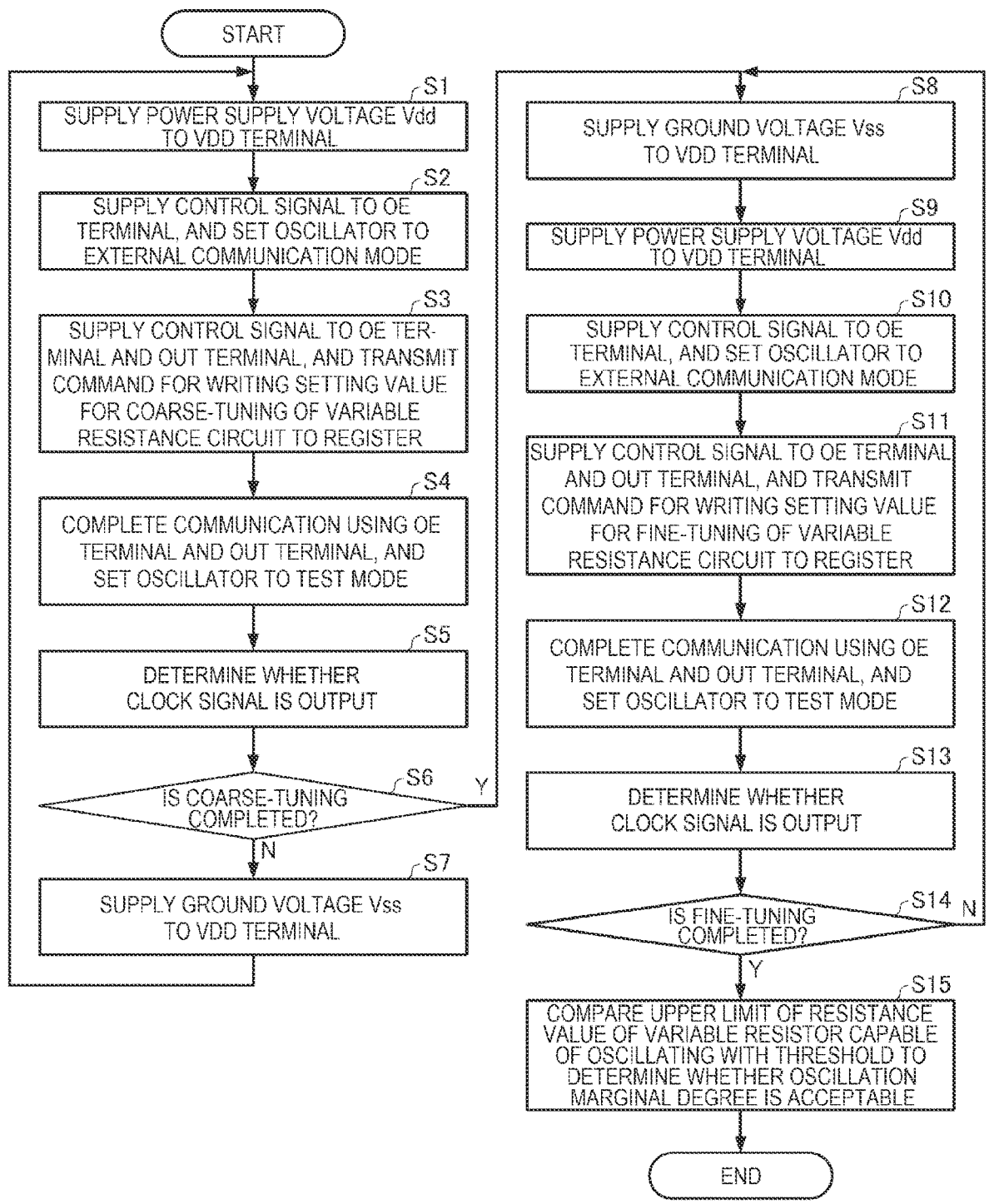
FIG. 10 is a flowchart showing an example of a procedure of a method of testing an oscillation marginal degree using the test device.
Figure 11:
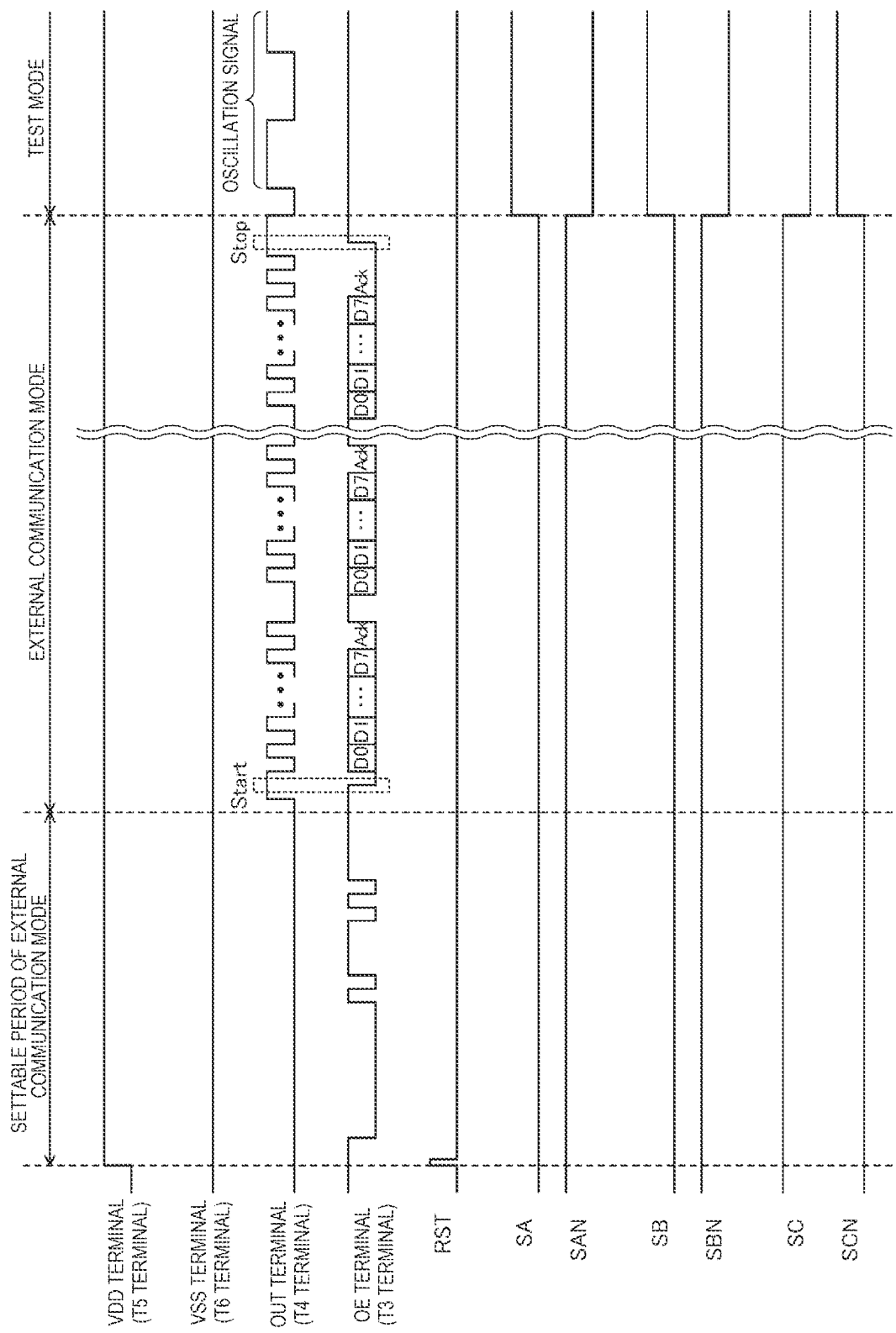
FIG. 11 is a diagram showing an example of voltage waveforms of each terminal and each signal when the test device tests the oscillation marginal degree.

FIG. 10 is a flowchart showing an example of a procedure of a method of testing the oscillation marginal degree using the test device 100 in the test system of FIG. 9. FIG. 11 is a diagram showing an example of voltage waveforms of each terminal and each signal when the oscillation marginal degree is tested according to the flowchart of FIG. 10.

In the example of FIG. 10, first, in step S1, the test device 100 supplies the power supply voltage Vdd to the VDD terminal of the oscillator 1. In step S1, as shown in FIG. 11, the VDD terminal rises from the ground voltage Vss to a desired voltage. Accordingly, the reset signal RST which is at the high level for a predetermined period is generated, and each bit of the register 52 is initialized. As a result, the control signals SA, SB, and SCN are initialized to the low level, the control signals SAN, SBN, and SC are initialized to the high level, the switches 101 and 102 are turned off, and the switch 103 is turned on.

Next, in step S2, the test device 100 supplies a control signal to the OE terminal of the oscillator 1, and sets the oscillator 1 to the external communication mode. That is, as shown in FIG. 11, the test device 100 supplies a predetermined signal having a predetermined pattern to the OE terminal of the oscillator 1 within a predetermined period after supplying the power supply voltage Vdd to the VDD terminal, and sets the oscillator 1 to the external communication mode.

Next, in step S3, the test device 100 supplies a control signal to the OUT terminal and the OE terminal of the oscillator 1, and transmits a command for writing a setting value for coarse-tuning of the variable resistance circuit 16 to the register 52. That is, as shown in FIG. 11, the test device 100 fixes a logic level of the OUT terminal to the high level and changes a logic level of the OE terminal from the high level to the low level, thereby establishing a start condition and starting communication. Then, the test device 100 inputs a serial data signal from the OE terminal, inputs a serial clock signal from the OUT terminal, and transmits a command for writing a desired value to each bit of the register 52.

Next, in step S4, the test device 100 completes the communication using the OE terminal and the OUT terminal, and sets the oscillator 1 to the test mode. That is, as shown in FIG. 11, the test device 100 fixes the logic level of the OUT terminal to the high level and changes the logic level of the OE terminal from the low level to the high level, thereby establishing a stop condition and completing the communication. Accordingly, the serial interface circuit 51 writes a desired setting value to the register 52, the external communication mode completes, and the oscillator 1 is set to the test mode. In the example of FIG. 6, the resistance value of the variable resistor 110 is determined by turning on or off the eleven switches 111 to 121. That is, the resistance value of the variable resistor 110 is controlled by the setting value of 11 bits in which control bits of the switches 111 to 121 are allocated in order from a lower-order bit. In step S3, the test device 100 transmits a command for writing, for example, zero to the lower-order 4 bits and the setting value for coarse-tuning to the upper-order 7 bits among the setting value of 11 bits. Accordingly, in the test mode, the resistance value of the variable resistor 110 becomes the desired value. In step S3, the test device 100 transmits a command for writing a setting value to a bit for controlling the switches 101, 102, and 103. Accordingly, as shown in FIG. 11, the control signals SA, SB, and SCN change from the low level to the high level, the control signals SAN, SBN, and SC change from the high level to the low level, the switches 101 and 102 are turned on, and the switch 103 is turned off. As a result, in the test mode, the variable resistor 110 having a desired resistance value is coupled in series to the resonator 3.

Next, in step S5, the test device 100 determines whether the clock signal CK is output from the oscillator 1. Specifically, the test device 100 outputs a control signal at a high level to the OE terminal, and determines whether the clock signal CK is output from the OUT terminal.

Next, in step S6, the test device 100 determines whether to complete the coarse-tuning based on a determination result of step S5. When the coarse-tuning is not completed, the test device 100 supplies the ground voltage Vss to the VDD terminal of the oscillator 1 in step S7, and then performs step S1 and the subsequent steps again. Then, the test device 100 repeats steps S1 to S7 until the coarse-tuning is completed in step S6. For example, the test device 100 may repeat steps S1 to S7, obtain, by a binary search method or the like, a setting value serving as a boundary between a range of the setting value in which the clock signal CK is output and a range of the setting value in which the clock signal CK is not output, and complete the coarse-tuning when the setting value of the boundary is obtained.

When the coarse-tuning is completed in step S6, the test device 100 supplies the ground voltage Vss to the VDD terminal of the oscillator 1 in step S8, and then supplies the power supply voltage Vdd to the VDD terminal of the oscillator 1 in step S9. Accordingly, the reset signal RST which is at the high level for a predetermined period is generated, and each bit of the register 52 is initialized. As a result, the control signals SA, SB, and SCN are initialized to the low level, the control signals SAN, SBN, and SC are initialized to the high level, the switches 101 and 102 are turned off, and the switch 103 is turned on.

Next, in step S10, the test device 100 supplies a control signal to the OE terminal of the oscillator 1, and sets the oscillator 1 to the external communication mode. That is, as shown in FIG. 11, the test device 100 supplies a predetermined signal having a predetermined pattern to the OE terminal of the oscillator 1 within a predetermined period after supplying the power supply voltage Vdd to the VDD terminal, and sets the oscillator 1 to the external communication mode.

Next, in step S11, the test device 100 supplies a control signal to the OUT terminal and the OE terminal of the oscillator 1, and transmits a command for writing a setting value for fine-tuning of the variable resistance circuit 16 to the register 52. That is, as shown in FIG. 11, the test device 100 fixes a logic level of the OUT terminal to the high level and changes a logic level of the OE terminal from the high level to the low level, thereby establishing a start condition and starting communication. Then, the test device 100 inputs a serial data signal from the OE terminal, inputs a serial clock signal from the OUT terminal, and transmits a command for writing a desired value to each bit of the register 52.

Next, in step S12, the test device 100 completes the communication using the OE terminal and the OUT terminal, and sets the oscillator 1 to the test mode. That is, as shown in FIG. 11, the test device 100 fixes the logic level of the OUT terminal to the high level and changes the logic level of the OE terminal from the low level to the high level, thereby establishing a stop condition and completing the communication. Accordingly, the serial interface circuit 51 writes a desired setting value to the register 52, the external communication mode completes, and the oscillator 1 is set to the test mode. In the case of the example of FIG. 6, in step S11, the test device 100 transmits a command for writing the setting value of the boundary obtained by the coarse-tuning to the upper-order 7 bits and writing the setting value for fine-tuning to the lower-order 4 bits among the setting values of 11 bits in which the control bits of the switches 111 to 121 are allocated in order from the lower-order bit. Accordingly, in the test mode, the resistance value of the variable resistor 110 becomes the desired value. In step S11, the test device 100 transmits a command for writing a setting value to a bit for controlling the switches 101, 102, and 103. Accordingly, as shown in FIG. 11, the control signals SA, SB, and SCN change from the low level to the high level, the control signals SAN, SBN, and SC change from the high level to the low level, the switches 101 and 102 are turned on, and the switch 103 is turned off. As a result, in the test mode, the variable resistor 110 having a desired resistance value is coupled in series to the resonator 3.

Next, in step S13, the test device 100 determines whether the clock signal CK is output from the oscillator 1. Specifically, the test device 100 outputs a control signal at a high level to the OE terminal, and determines whether the clock signal CK is output from the OUT terminal.

Next, in step S14, the test device 100 determines whether to complete the fine-tuning based on a determination result of step S13. When the fine-tuning is not completed, the test device 100 performs step S8 and the subsequent steps again. Then, the test device 100 repeats steps S8 to S13 until the fine-tuning is completed in step S14. For example, the test device 100 may repeat steps S8 to S13, obtain, by the binary search method or the like, a boundary between the setting value in which the clock signal CK is output and the setting value in which the clock signal CK is not output, and complete the fine-tuning when the boundary is obtained.

When the fine-tuning is completed in step S14, finally, in step S15, the test device 100 compares an upper limit of the resistance value of the variable resistor 110 that can oscillate by the oscillator 1 with a threshold to determine whether the oscillation marginal degree is acceptable. For example, the test device 100 may calculate the upper limit of the resistance value of the variable resistor 110 that can oscillate by the oscillator 1 from the setting value of the boundary obtained by the fine-tuning, and may determine that the variable resistor 110 passes when the upper limit is equal to or greater than the threshold, and determine that the variable resistor 110 fails when the upper limit is less than the threshold.

3. Operation and Effect

As described above, in the oscillator 1 according to the embodiment, in the normal operation mode of the circuit device 2, the switches 101 and 102 are turned off, and the resonator 3 and the variable resistor 110 are electrically cut off from each other. Therefore, the variable resistor 110 hardly influences the negative resistance. In the normal operation mode, when the switch 103 is turned on and the logic inversion circuit 11 as the amplifier circuit and the resonator 3 are electrically coupled to each other, the resonator 3 oscillates. However, the influence on the negative resistance due to an on-resistance and a parasitic capacitance of the switch 103 is extremely small. On the other hand, in the test mode, since the switches 101 and 102 are turned on, the switch 103 is turned off, and the resonator 3 and the variable resistor 110 are electrically coupled to each other, the test device 100 can test the oscillation marginal degree of the resonator 3 by changing the resistance value of the variable resistor 110. As described above, according to the oscillator 1 of the embodiment, the influence of the variable resistor 110 for test on the negative resistance can be reduced.

In the oscillator 1 according to the embodiment, in the normal operation mode of the circuit device 2, when all of the plurality of switches 111 to 121 provided in the variable resistor 110 are turned on, the resistance value of the variable resistor 110 ideally becomes zero. Actually, the variable resistor 110 has a predetermined resistance value based on on-resistances of the switches 111 to 121. Regarding this, according to the oscillator 1 of the embodiment, in the normal operation mode, since the switches 101 and 102 are turned off, and the resonator 3 and the variable resistor 110 are electrically cut off from each other, the negative resistance is hardly influenced by the plurality of resistors 131 to 141 and the plurality of switches 111 to 121 provided in the variable resistor 110.

In the oscillator 1 according to the embodiment, in the circuit device 2, the resistance values of the plurality of resistors 131 to 141 provided in the variable resistor 110 are binary weighted. Accordingly, the test device 100 can change the resistance value of the variable resistor 110 by a certain amount by appropriately controlling the plurality of switches 111 to 121, and thus can test the oscillation marginal degree with high accuracy and efficiency.

In the oscillator 1 according to the embodiment, in the circuit device 2, variation of a load capacitance due to the on and off of the switches 111 to 114 coupled to the resistors 131 to 134 for fine-tuning having a small resistance value among the resistors 131 to 141 provided in the variable resistor 110 has a largest influence on the negative resistance. Regarding this, according to the oscillator 1 of the embodiment, in the circuit device 2, since the dummy switches 151 to 154 operate in a converse logic to that of the switches 111 to 114 coupled thereto, the variation of the load capacitance due to the on and off of the switches 111 to 114 for fine-tuning having a small resistance value is prevented. Accordingly, according to the oscillator 1 of the embodiment, the influence of the variable resistor 110 for test on the negative resistance can be reduced.

4. Modification

The present disclosure is not limited to the embodiment, and various modifications can be made within the scope of the gist of the present disclosure.

For example, the oscillator 1 according to the above embodiment is a simple oscillator such as an SPXO, and may be an oscillator having a temperature compensation function such as a TCXO, or may be an oscillator having a frequency control function such as a VCXO. SPXO is an abbreviation for a simple packaged crystal oscillator. TCXO is an abbreviation for a temperature compensated crystal oscillator. VCXO is an abbreviation for a voltage controlled crystal oscillator. The oscillator 1 may be an oscillator having the temperature compensation function and the frequency control function such as a VC-TCXO, or may be an oscillator having a temperature control function such as an OCXO. VC-TCXO is an abbreviation for a voltage controlled temperature compensated crystal oscillator. OCXO is an abbreviation for an oven controlled crystal oscillator.

In the above embodiment, a signal for controlling the output of the output buffer 20 is input to the T3 terminal, but other control signals may be input. For example, a control signal for setting the oscillator 1 to a standby mode may be input to the T3 terminal, or a signal for controlling the frequency of the clock signal CK may be input to the T3 terminal when the oscillator 1 is an oscillator having the frequency control function such as a VCXO.

The above embodiment and modification are examples, and the present disclosure is not limited thereto. For example, the embodiment and the modification may be combined as appropriate.

The present disclosure has substantially the same configurations as the configurations described in the embodiment, such as a configuration having the same function, method, and result and a configuration having the same object and effect. The present disclosure has a configuration in which a non-essential portion of the configuration described in the embodiment is replaced. The present disclosure may have a configuration capable of achieving the same function and effect or a configuration capable of achieving the same object as the configuration described in the embodiment. The present disclosure has a configuration obtained by adding a known technique to the configuration described in the embodiment.

The following contents are derived from the above embodiment and modification.

A circuit device according to an aspect includes:
  a first terminal and a second terminal coupled to a resonator;
  an amplifier circuit configured to amplify a signal from the first terminal and output the amplified signal to the second terminal;
  a variable resistance circuit that is provided on a signal path between the amplifier circuit and the second terminal and includes a variable resistor, a first switch provided at one end of the variable resistor, and a second switch provided at the other end of the variable resistor;

a third switch coupled in parallel to the variable resistance circuit; and a control circuit configured to control a resistance value of the variable resistor and control the first switch, the second switch, and the third switch to be turned on or off.

In the circuit device, the control circuit controls the first switch and the second switch to be turned on and controls the third switch to be turned off, so that the resonator oscillates in a state where the resonator and the variable resistor are electrically coupled to each other. Therefore, the test device coupled to the circuit device can test an oscillation marginal degree of the resonator by changing the resistance value of the variable resistor. On the other hand, when the control circuit controls the first switch and the second switch to be turned off, the resonator and the variable resistor are electrically cut off from each other, and when the control circuit controls the third switch to be turned on, the amplifier circuit and the resonator are electrically coupled to each other without the variable resistor interposed therebetween. Therefore, the resonator oscillates without substantially influencing a negative resistance caused by the variable resistor. As described above, according to the circuit device, the influence of the variable resistor for test on the negative resistance can be reduced.

In the circuit device according to the aspect, the first switch and the second switch may be turned off and the third switch may be turned on in a first mode, and the first switch and the second switch may be turned on and the third switch may be turned off in a second mode.

According to the circuit device, in the first mode, the first switch and the second switch are turned off, and the resonator and the variable resistor are electrically cut off from each other. Therefore, the variable resistor hardly influences the negative resistance. In the first mode, when the third switch is turned on and the amplifier circuit and the resonator are electrically coupled to each other, the resonator oscillates. However, the influence on the negative resistance due to an on-resistance and a parasitic capacitance of the third switch is extremely small. On the other hand, in the second mode, since the first switch and the second switch are turned on, the third switch is turned off, and the resonator and the variable resistor are electrically coupled to each other, the test device can test the oscillation marginal degree of the resonator by changing the resistance value of the variable resistor.

In the circuit device according to the aspect, the variable resistor may include a plurality of resistors coupled in series and a plurality of resistance value control switches coupled in parallel with the plurality of resistors.

According to the circuit device, in the first mode, the first switch and the second switch are turned off, and the resonator and the variable resistor are electrically cut off from each other. Therefore, the plurality of resistors and the plurality of resistance value control switches provided in the variable resistor hardly influence the negative resistance.

In the circuit device according to the aspect, the plurality of resistors may include at least two resistors having different resistance values.

In the circuit device according to the aspect, resistance values of the plurality of resistors may be binary weighted.

According to the circuit device, the test device can change the resistance value of the variable resistor by a certain amount by appropriately controlling the plurality of resistance value control switches, and thus can test the oscillation marginal degree with high accuracy and efficiency.

In the circuit device according to the aspect, the variable resistance circuit may include at least one dummy switch that is coupled to at least a part of the plurality of resistance value control switches and that is turned on or off in a converse logic to that of each of the at least a part of the resistance value control switches.

In the circuit device, each dummy switch operates in a converse logic to that of the coupled resistance value control switch, and thus variation of a load capacitance due to the on and off of the resistance value control switch can be prevented. Accordingly, according to the circuit device, linearity of the negative resistance due to the resistance value of the variable resistor can be improved.

In the circuit device according to the aspect, the at least one dummy switch may include a first dummy switch coupled to a resistor having a smallest resistance value among the plurality of resistors.

In the circuit device, the variation of the load capacitance due to the on and off of the resistance value control switch coupled to the resistor having the smallest resistance value among the plurality of resistors provided in the variable resistor has a largest influence on the negative resistance. Regarding this, the first dummy switch coupled to the resistor having the smallest resistance value operates in a converse logic to that of the coupled resistance value control switch, and thus the variation of the load capacitance due to the on and off of the resistance value control switch can be prevented. Accordingly, according to the circuit device, linearity of the negative resistance due to the resistance value of the variable resistor can be improved.

An oscillator according to an aspect includes:

a resonator;

a circuit device coupled to the resonator; and a container accommodating the resonator and the circuit device, in which the circuit device includes:

a first terminal and a second terminal coupled to the resonator;

an amplifier circuit configured to amplify a signal from the first terminal and output the amplified signal to the second terminal;

a variable resistance circuit that is provided on a signal path between the amplifier circuit and the second terminal and includes a variable resistor, a first switch provided at one end of the variable resistor, and a second switch provided at the other end of the variable resistor;

a third switch coupled in parallel to the variable resistance circuit; and a control circuit configured to control a resistance value of the variable resistor and control the first switch, the second switch, and the third switch to be turned on or off.

In the oscillator, in the circuit device, the control circuit controls the first switch and the second switch to be turned on and controls the third switch to be turned off, so that resonator oscillates in a state where the resonator and the variable resistor are electrically coupled to each other. Therefore, the test device coupled to the oscillator can test the oscillation marginal degree of the resonator by changing the resistance value of the variable resistor. On the other hand, when the control circuit controls the first switch and the second switch to be turned off, the resonator and the variable resistor are electrically cut off from each other, and when the control circuit controls the third switch to be turned on, the amplifier circuit and the resonator are electrically coupled to each other without the variable resistor interposed therebetween. Therefore, the resonator oscillates without substantially influencing a negative resistance caused by the variable resistor. As described above, according to the oscillator, the influence of the variable resistor for test on the negative resistance can be reduced.

What is claimed is:

1. A circuit device comprising:
   a first terminal and a second terminal coupled to a resonator;
   an amplifier circuit configured to amplify a signal from the first terminal and output the amplified signal to the second terminal;
   a variable resistance circuit that is provided on a signal path between the amplifier circuit and the second terminal and includes a variable resistor, a first switch provided at one end of the variable resistor, and a second switch provided at the other end of the variable resistor;
   a third switch coupled in parallel to the variable resistance circuit; and
   a control circuit configured to control a resistance value of the variable resistor and control the first switch, the second switch, and the third switch to be turned on or off.

2. The circuit device according to claim 1, wherein
   the first switch and the second switch are turned off and the third switch is turned on in a first mode, and
   the first switch and the second switch are turned on and the third switch is turned off in a second mode.

3. The circuit device according to claim 1, wherein
   the variable resistor includes a plurality of resistors coupled in series and a plurality of resistance value control switches coupled in parallel with the plurality of resistors.

4. The circuit device according to claim 3, wherein
   the plurality of resistors include at least two resistors having different resistance values.

5. The circuit device according to claim 4, wherein
   resistance values of the plurality of resistors are binary weighted.

6. The circuit device according to claim 3, wherein
   the variable resistance circuit includes at least one dummy switch that is coupled to at least a part of the plurality of resistance value control switches and that is turned on or off in a converse logic to that of each of the at least a part of the resistance value control switches.

7. The circuit device according to claim 6, wherein
   the at least one dummy switch includes a first dummy switch coupled to a resistor having a smallest resistance value among the plurality of resistors.

8. An oscillator comprising:
   a resonator;
   a circuit device coupled to the resonator; and
   a container accommodating the resonator and the circuit device, wherein
   the circuit device includes:
   a first terminal and a second terminal coupled to the resonator;
   an amplifier circuit configured to amplify a signal from the first terminal and output the amplified signal to the second terminal;
   a variable resistance circuit that is provided on a signal path between the amplifier circuit and the second terminal and includes a variable resistor, a first switch provided at one end of the variable resistor, and a second switch provided at the other end of the variable resistor;
   a third switch coupled in parallel to the variable resistance circuit; and
   a control circuit configured to control a resistance value of the variable resistor and control the first switch, the second switch, and the third switch to be turned on or off.

* * * * *